US012684904B2

(12) United States Patent
Zhu et al.

(10) Patent No.: US 12,684,904 B2
(45) Date of Patent: Jul. 14, 2026

(54) METHOD OF CONTROLLING BOW IN A SEMICONDUCTOR STRUCTURE, SEMICONDUCTOR STRUCTURE, AND SEMICONDUCTOR DEVICE

(71) Applicant: PORO TECHNOLOGIES LTD, Cambridge (GB)

(72) Inventors: Tongtong Zhu, Cambridge (GB); Yingjun Liu, Cambridge (GB); Muhammad Ali, Cambridge (GB)

(73) Assignee: PORO TECHNOLOGIES LTD, Cambridge (GB)

( * ) Notice: Subject to any disclaimer, the term of this patent is extended or adjusted under 35 U.S.C. 154(b) by 369 days.

(21) Appl. No.: 18/548,644

(22) PCT Filed: Mar. 3, 2022

(86) PCT No.: PCT/GB2022/050571
§ 371 (c)(1),
(2) Date: Sep. 1, 2023

(87) PCT Pub. No.: WO2022/185067
PCT Pub. Date: Sep. 9, 2022

(65) Prior Publication Data
US 2024/0154059 A1 May 9, 2024

(30) Foreign Application Priority Data
Mar. 3, 2021 (GB) ..................................... 2102999

(51) Int. Cl.
*H01L 33/12* (2010.01)
*H01L 33/00* (2010.01)
(Continued)

(52) U.S. Cl.
CPC ...... *H10H 20/815* (2025.01); *H10H 20/0137* (2025.01); *H10H 20/825* (2025.01)

(58) Field of Classification Search
CPC ............ H10H 20/815; H10H 20/0137; H10H 20/825; H10H 20/01335; H01L 21/02458;
(Continued)

(56) References Cited

U.S. PATENT DOCUMENTS

2009/0140274 A1* 6/2009 Wierer, Jr. ........... H10H 20/018
257/97
2016/0284935 A1 9/2016 Wierer et al.
2020/0227255 A1 7/2020 Zhu et al.

FOREIGN PATENT DOCUMENTS

TW 201704566 A 2/2017
WO 2019/063957 4/2019
(Continued)

OTHER PUBLICATIONS

International Preliminary Report on Patentability of PCT/GB2022/050571, Aug. 29, 2023, 9 pages.
(Continued)

*Primary Examiner* — Tong-Ho Kim
(74) *Attorney, Agent, or Firm* — Merchant & Gould P.C.

(57) ABSTRACT

A method of controlling bow in a layered semiconductor structure comprises the steps of: providing a layered semiconductor structure comprising a first layer of III-nitride semiconductor material on a substrate, the layered semiconductor structure having a first bow, and forming a porous region of III-nitride semiconductor material over the first layer of III-nitride semiconductor material, in which the layered semiconductor structure comprising the porous region has a second bow different from the first bow. A semiconductor structure having controllable bow comprises a first layer of III-nitride semiconductor material on a substrate, and a porous region of III-nitride semiconductor material over the first layer of III-nitride semiconductor material. The layered semiconductor structure comprising
(Continued)

Epitaxial semiconductor structures/layers — 50, 40
Porous region — 30
III-nitride layer — 20
Substrate — 10 the porous region has a second bow, and the second bow is tunable by tuning a porosity and/or thickness of the porous region.

22 Claims, 4 Drawing Sheets

(51) Int. Cl.

| | |
|---|---|
| *H01L 33/32* | (2010.01) |
| *H10H 20/01* | (2025.01) |
| *H10H 20/815* | (2025.01) |
| *H10H 20/825* | (2025.01) |

(58) Field of Classification Search
CPC ......... H01L 21/02505; H01L 21/02513; H01L 21/0254; H01L 21/02587
USPC .......................................................... 257/76
See application file for complete search history.

(56) References Cited

FOREIGN PATENT DOCUMENTS

| | | |
|---|---|---|
| WO | 2019/145728 | 8/2019 |
| WO | 2020/245423 | 12/2020 |
| WO | 2021/244769 | 12/2021 |

OTHER PUBLICATIONS

Mynbaeva M. et al., "Structural characterization and strain relaxation in porous GaN layers," Applied Physics Letters, American Institute of Physics, vol. 76, No. 9, Feb. 28, 2000, pp. 1113-1115.
International Search Report and Written Opinion of PCT/GB2022/050571, Jun. 8, 2022, 16 pages.

* cited by examiner

METHOD OF CONTROLLING BOW IN A SEMICONDUCTOR STRUCTURE, SEMICONDUCTOR STRUCTURE, AND SEMICONDUCTOR DEVICE

The present invention relates to semiconductor structures, semiconductor devices and methods of manufacturing such semiconductor structures and devices. In particular, the invention relates to methods of controlling stress and bow in a layered semiconductor structure, and to applications in semiconductor devices such as LEDs, and power and RF electronics.

BACKGROUND

Layered semiconductor structures, which typically comprise one or more layers of semiconductor material epitaxially grown on a suitable substrate wafer, often suffer from curvature, or bow, of the wafer out of its intended flat shape, caused by differences in the material properties of different materials creating stress in the structure. For example, differences in the coefficients of thermal expansion between different layers of the structure, or between layers of the structure and the underlying substrate, can result in stresses that lead to significant warping or bowing of the overall structure. This can lead to wafer cracking in the semiconductor layers and structures or undesirable modification of the inherent properties of the epitaxial layers.

Processing steps can also contribute to the undesired bowing of the structure. For example. epitaxial deposition steps carried out at high temperature can induce stresses into the layered semiconductor structure.

The stresses introduced into the structure can in some cases alter the properties of the semiconductor structure, and create unwanted strains and stresses in semiconductor devices overgrown onto the semiconductor structure.

Wafer bow can also be extremely problematic for subsequent processing steps, and semiconductor device manufacture. For example, automated wafer handling systems are configured to handle flat wafers, and bowing or warping of the wafer can interfere with further epitaxial growth steps or lithographic processing.

It is therefore highly desirable to control the bow and stress in layered semiconductor structures, preferably to reduce or eliminate entirely the shape distortions introduced into the structure during manufacturing.

SUMMARY OF INVENTION

The present application relates to an improved method of controlling bow in a layered semiconductor structure, and to semiconductor structures and devices made using that method. The present invention is defined in the independent claims, to which reference should now be made. Preferred or advantageous features of the invention are set out in the dependent sub-claims.

The layered semiconductor structure is preferably formed from III-V semiconductor material, particularly preferably from III-nitride semiconductor material.

"III-V" semiconductors include binary, ternary and quaternary alloys of Group III elements, such as Ga, Al and In, with Group V elements, such as N, P, As and Sb, and are of great interest for a number of applications, including optoelectronics.

Of particular interest is the class of semiconductor materials known as "μl-nitride" materials, which includes gallium nitride (GaN), indium nitride (InN) and aluminium nitride (AlN), along with their ternary and quaternary alloys. III-nitride materials have not only achieved commercial success in solid-state lighting and power electronics, but also exhibit particular advantages for quantum light sources and light-matter interaction.

While a variety of III-nitride materials are commercially interesting, Gallium nitride (GaN) is widely regarded as one of the most important new semiconductor materials, and is of particular interest for a number of applications.

It is known that the introduction of pores into bulk GaN can profoundly affect its material properties, for example its refractive index. The possibility of tuning the optical properties of GaN by altering its porosity therefore makes porous GaN of great interest for optoelectronic applications.

The present invention will be described by reference primarily to GaN but may advantageously be applicable to alternative III-nitride materials.

Prior publications relating to the porosification of III-V semiconductor material include international patent applications PCT/GB2017/052895 (published as WO2019/063957) and PCT/GB2019/050213 (published as WO2019/145728).

Method of Controlling Bow in a Semiconductor Structure

According to a first aspect of the present invention there is provided a method of controlling bow in a layered semiconductor structure, the method comprising the steps of: providing a layered semiconductor structure comprising a first layer of III-nitride semiconductor material on a substrate, the layered semiconductor structure having a first bow; and forming a porous region of III-nitride semiconductor material over the first layer of III-nitride semiconductor material, in which the layered semiconductor structure comprising the porous region has a second bow different from the first bow.

As discussed above, providing a layered semiconductor structure comprising a first layer of semiconductor structure on a substrate frequently introduces a "bow", or curvature out of flat, into what was originally a flat substrate. This is caused primarily by differences in the material properties between the substrate wafer itself and the material from which the first layer of III-nitride semiconductor material is formed.

The bow in the structure at any point in time may be defined as the deviation of the centre point of the median surface of a free, un-clamped semiconductor structure from a reference plane. As is typical in the art, the reference plane may be defined by three corners of an equilateral triangle.

Wafer bow can be measured according to conventional techniques well known in the art.

The first bow in this case is therefore the bow of the first layer and the substrate before the porous region has been formed.

The first layer may be formed directly on the substrate, or alternatively there may be one or more intermediate layers of semiconductor material disposed between the substrate and the first layer of III-nitride material.

By forming a porous region over the first layer of III-nitride material on the substrate, the inventors have found that the overall bow of the structure can be altered, and particularly advantageously that it can be reduced or eliminated so that the resulting structure is flat, or at least less bowed than it was prior to formation of the porous region.

The second bow in this case is therefore the bow of the semiconductor structure including the porous region, the first layer, and the substrate after the porous region has been formed.

The second bow is preferably closer to zero bow than the first bow. In other words, the semiconductor structure including the porous region, the first layer, and the substrate after the porous region has been formed is flatter, or closer to being completely flat, than the semiconductor structure before the porous region is formed.

The first bow may be a concave bow, in which case the second bow may be less concave than the first bow.

The first bow may be a convex bow, in which case the second bow may be less convex than the first bow.

The second bow is preferably between 1% and 80% less than the first bow, preferably between 3% and 70% less than the first bow, particularly preferably between 8% and 65% less than the first bow. The second bow may be between 10% and 50% less than the first bow, or between 15% and 40% less than the first bow, particularly for example between 18% and 35% less than the first bow.

In preferred embodiments, the second bow is between ±1 μm and ±150 μm (±in order to account for both convex and concave bows) less than the first bow, preferably between ±10 μm and ±100 μm less than the first bow, particularly preferably between ±25 μm and ±50 μm less than the first bow.

The reduction in the bow may be measured by measuring the maximum displacement of the wafer out of the intended flay plane prior to formation of the porous region, and measuring the maximum displacement of the wafer out of the intended flat plane after formation of the porous region. While the bow may have positive or negative values, (i.e. concave or convex), the maximum displacement of the wafer out of the intended plane is reduced by formation of the porous region. That is, the wafer moves towards the intended "flat", or planar, shape following the formation of the porous region.

The method may include the step of tuning the second bow, in which tuning the second bow comprises tuning at least one of the porosity, or the thickness, composition, or the lateral shape and size of the porous region. The thickness and lateral shape and size of the porous region may be tuned by controlling the thickness, shape and size of the n-doped region of III-nitride material deposited prior to porosification. The thickness of the porous region may also be tuned by controlling the depth to which porosification extends downwards into the III-nitride material during electrochemical porosification. The porosity of the porous region may be tuned by controlling the electrochemical porosification parameters and/or by controlling the doping concentration of the n-doped region of III-nitride material deposited prior to porosification. Tuning the second bow may also comprise the application of in-situ epitaxial growth parameters/conditions for the adjustment of porosity, pore size, distribution, shape of the porous region prior to proceeding with any subsequent semiconductor device, which can be monitored by in-situ wafer curvature tools that are known to the art.

Tuning the second bow may comprise compensating the first bow that results from the substrate and the first layer of III-nitride material having different thermal coefficients of expansion.

The method may comprise the step of forming, over the porous region, one or more further layers of III-nitride material. The method may comprise forming a second layer of III-nitride material over the porous region. The second III-nitride layer may contain one or a combination of these elements: Al, Ga, In (binary, ternary or quaternary layer). For example the second III-nitride layer may be GaN, InGaN, AlGaN, or InAlGaN.

Tuning the second bow may comprise compensating for the characteristics of the one or more further layers of III-nitride material (such as the second layer) to be grown over the porous region. For example if the second layer of III-nitride material has a coefficient of thermal expansion different from that of the underlying semiconductor structure, the porous layer may be tuned to offset the bow that will be created by the second layer of III-nitride material when it is epitaxially grown. For example the bow may compensate stress that results from the semiconductor structure and the second layer of III-nitride material having different coefficients of thermal expansion.

The porous region preferably has a thermal coefficient of expansion which is different to the thermal coefficients of expansion of the substrate and any further III-nitride layer(s) deposited on top of the porous region. The porous region can therefore advantageously be compliant and result in a different curvature at high temperature during the epitaxial deposition of further III-nitride layers on top of the porous region.

The present inventors have realised that electrochemical porosification of III-nitride materials advantageously leads to a reduction in the strain in the III-nitride lattice, and a reduction in the overall wafer bow and/or warp and curvature. Without wishing to be bound by theory, it is thought that the process of porosifying the porous region of III-nitride material also etches away structural defects, such as threading dislocations which were formed during growth of that layer on top of the layer of first III-nitride material.

The removal of dislocations from the semiconductor material of the porous region during porosification greatly reduces the strain in the porous region, which occurs particularly if the lattice dimension of the porous region does not match the lattice dimension of the underlying material. Thus, during subsequent epitaxial growth, when layers of III-nitride material are deposited above the porous region, the porous material is more compliant to matching the lattice of the overlying non-porous layers. This results in the layers above the porous region experiencing significantly lower strain than would be the case without the porous region.

The method of manufacturing an LED device may comprise a first step of electrochemically porosifying a layer of III-nitride material, to form the porous region of III-nitride material. This may be achieved using a wafer scale porosification process as set out in international patent applications PCT/GB2017/052895 (published as WO2019/063957) and PCT/GB2019/050213 (published as WO2019/145728). This step should preferably be carried out prior to forming any further n-doped layers of III-nitride material over the porous region, so that the overgrown n-doped layers are not also electrochemically porosified.

The method may preferably comprise the step of forming the porous region of III-nitride material by electrochemical porosification through a non-porous layer of III-nitride material, such that the non-porous layer of III-nitride material forms a non-porous intermediate layer over the porous region. The non-porous intermediate layer may advantageously provide a smooth surface for overgrowth of further semiconductor layers or structures (such as device structures), as the intermediate layer is positioned between the porous region and the overgrown structure.

The porous region may be formed by porosifying one or more layers or regions of III-nitride material. In order for the III-nitride material to be porosifiable, the material to be porosified should be n-type doped and have a doping concentration in the range of $1 \times 10^{17}$ to $1 \times 10^{20}$.

The porous region may be a porous layer, such that the method comprises the step of forming porous layer of III-nitride material over the first layer of III-nitride material. Preferably the porous region may be a porous layer that is uniformly porous, for example formed from a continuous layer of porous III-nitride material. The porous region may be a continuous porous layer having a uniform porosity, which extends over the lateral width of the first layer of III-nitride material.

The porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. Further layers of III-nitride material may be formed over a porous region comprising a stack of porous layers of III-nitride material.

Alternatively the porous region may be a layer of III-nitride material that contains one or more porous regions, for example one or more porous regions in an otherwise non-porous layer of III-nitride material. A plurality of porous regions may thus be located at different positions within the same layer.

The porous region may extend over only a portion of the lateral width of the first layer of III-nitride material, for example in which the porous region is patterned on the first layer. Multiple non-continuous porous regions may be formed over the first III-nitride layer, for example at different lateral or horizontal positions on the semiconductor structure.

In preferred embodiments, the porous region, or porous layer, may have a lateral dimension (width or length) equivalent to that of the substrate and/or the first layer of III-nitride material on which the porous layer or region is grown. For example, conventional substrate wafer sizes may have a variety of sizes, such as 1 cm², or 2 inch, 4 inch, 6 inch, 8 inch, 12 inch, or 16 inch diameter. By patterning one or more layers and/or depositing regions of different charge carrier concentrations in the same layer, however, smaller porous regions can be formed that do not span the entire substrate. The lateral dimensions of the porous layer or region may therefore vary from around $1/10$ of a pixel (for example 0.1 µm), up to the lateral dimensions of the substrate itself.

A region such as a layer, or a stack of layers, of n-doped III-nitride semiconductor material is grown over the first layer of III-nitride material on the substrate. The n-doped III-nitride region may contain one or a combination of these elements: Al, Ga, In (ternary of quaternary layer). The thickness of the III-nitride stack is preferably between 10-4000 nm. The III-nitride layer to be porosified may have a doping concentration between $1 \times 10^{17}$ cm⁻³-$5 \times 10^{20}$ cm⁻³.

Preferably an intermediate layer of undoped III-nitride material is deposited over the doped material before it is porosified. The intermediate layer preferably has a thickness of between 1 nm and 3000 nm, preferably between 5 nm and 2000 nm, or between 1000 nm and 1500 nm.

As is known in the art, electrochemical porosification removes material from n-type doped regions of III-nitride materials, and creates empty pores in the semiconductor material.

In preferred embodiments, prior to porosification the doped region consists of an alternating stack of layers that are in a sequence of highly-doped layer/low-doped layer. The stack may consist of high/low doping layer pairs, preferably wherein the stack contains between 2-100 pairs of layers. The thickness of each highly-doped layer may vary between 10 nm and 200 nm, or between 20 nm and 150 nm, or between 50 nm and 100 nm. Low-doped layers may have a thickness of between 5 nm and 180 nm, or between 20 nm and 150 nm, or between 50 nm and 100 nm.

The stack of porous layers may preferably be a stack of alternating porous and non-porous layers. Preferably the stack comprises between 2 and 100 pairs of porous and non-porous layers, stacked one on top of another. The porous layers may preferably have a thickness of between 2 nm and 200 nm, or between 10 nm and 150 nm, or between 20 nm and 100 nm. The non-porous layers may preferably have a thickness of between 2 nm and 180 nm, or between 10 nm and 150 nm, or between 50 nm and 100 nm.

The porous region, or each porous layer in the porous region, may have a porosity of between 1% and 99% porous. Preferably the porous region has a porosity of between 10% and 80% porosity, or between 20% and 70% porosity, or between 30% and 60% porosity. Thus if the porous region is a single porous layer, the porous layer preferably has a porosity of between 10% and 80% porosity, or between 20% and 70% porosity, or between 30% and 60% porosity. If the porous region is a stack of alternative porous and non-porous layers, preferably the overall porous region has a porosity of between 10% and 80% porosity, or between 20% and 70% porosity, or between 30% and 60% porosity.

The overall porosity of the semiconductor structure positioned on the substrate, including the first III-nitride layer and the porous region, may preferably be between 5% and 90% porous, or between 10% and 80% porous, or between 20% and 70% porous. Preferably the overall porosity of the semiconductor structure, including the first III-nitride layer, the porous region, and any buffer layers of semiconductor structure positioned between the substrate and the first layer of III-nitride material may preferably be between 5% and 90% porous, or between 10% and 80% porous, or between 20% and 70% porous. The overall porosity may preferably take into account the porosity (the volume of pores relative to the total volume of the semiconductor structure) of the entire semiconductor structure (first III-nitride layer, porous region, and any intermediate layers or buffer layers of III-nitride material) before any device structure is overgrown.

The present inventors have found that in layered semiconductor structures of the prior art containing porous layers, the effect of wafer bow reduction has not been observed, as the overall porosity of the semiconductor structures has been too low. By tuning the porosity of the overall semiconductor structure including the porous region and the first III-nitride layer, so that the overall porosity is greater than 5%, or greater than 10%, or greater than 15%, or greater than 20%, the inventors have found that a significant improvement in wafer bow can be achieved.

The porosity of the porous region, and of the other layers of the structure, can be measured by taking a cross-section of the semiconductor structure and measuring the size and volume of pores in the structure according to known techniques.

The porous region may have a thickness of between 100 nm and 10000 nm, preferably at least 500 nm or 1000 nm.

The substrate is the base material on which the deposited layers of the semiconductor structure are formed. The substrate may be Silicon, Sapphire, GaN, AlN, InGaN bulk, oxidized & porous silicon or glass/fused silica. The crystal orientation of the substrates can be polar, semi-polar or non-polar orientation. The substrate thickness may typically vary between 100 µm and 1500 µm. Conventional substrate wafer sizes may have a variety of sizes, such as 1 cm², or 2 inch, 4 inch, 6 inch, 8 inch, 12 inch, or 16 inch diameter. For example, the lateral size of the substrate can be 50 mm, 100 mm, 150 mm, 200 mm, 300 mm or even larger.

The substrate may be a wafer, in which a wafer comprises a uniform thickness of single-crystal material.

In a particularly preferred embodiment, the substrate may be silicon.

The first III-nitride layer preferably comprises a layer or stack of layers of III-nitride material which is epitaxially grown on or over the substrate. The first III-nitride layer may contain one or a combination of these elements: Al, Ga, In (binary, ternary or quaternary layer). For example the first III-nitride layer may be GaN, InGaN, AlGaN, or InAlGaN.

Preferably the first III-nitride layer contains one or more layers or stacks of the following, in any sequence: GaN, $Al_xGa_{1-x}N$ in which x=0-1, or $In_yGa_{1-y}N$ in which y=0-1.

The first III-nitride layer is preferably undoped, with an n-type doping concentration below $1\times10^{17}$ cm$^{-3}$.

The thickness of the first III-nitride layer may be between 100 nm and 5000 nm, preferably between 500 nm and 2000 nm.

The growth and/or deposition of semiconductor material may be performed using conventional techniques, for example one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HVPE), pulsed laser deposition (PLD), and/or physical vapor deposition (PVD).

According to a further aspect of the present invention there may be provided a method of controlling warp in a layered semiconductor structure, the method comprising the steps of: providing a layered semiconductor structure comprising a first layer of III-nitride semiconductor material on a substrate, the layered semiconductor structure having a first warp; and forming a porous region of III-nitride semiconductor material over the first layer of III-nitride semiconductor material, in which the layered semiconductor structure comprising the porous region has a second warp different from the first warp.

As discussed above, providing a layered semiconductor structure comprising a first layer of semiconductor structure on a substrate frequently introduces a "warp", or curvature out of flat, into what was originally a flat substrate. This is caused primarily by differences in the material properties between the substrate wafer itself and the material from which the first layer of III-nitride semiconductor material is formed.

The warp in the structure at any point in time may be defined as the difference between the maximum and the minimum distances of the median surface of a free, unclamped semiconductor structure from a reference plane. As is typical in the art, the reference plane may be defined by three corners of an equilateral triangle.

Wafer warp can be measured according to conventional techniques well known in the art.

The first warp in this case is therefore the warp of the first layer and the substrate before the porous region has been formed.

By forming a porous region over the first layer of III-nitride material on the substrate, the inventors have found that the overall warp of the structure can be altered, and particularly advantageously that it can be reduced or eliminated so that the resulting structure is flat, or at least less warped than it was prior to formation of the porous region.

The second warp in this case is therefore the bow of the semiconductor structure including the porous region, the first layer, and the substrate after the porous region has been formed.

The second warp is preferably closer to zero warp than the first warp. In other words, the semiconductor structure including the porous region, the first layer, and the substrate after the porous region has been formed is flatter, or closer to being completely flat, than the semiconductor structure before the porous region is formed. The method may include the step of tuning the second warp, in which tuning the second warp comprises tuning at least one of the porosity, or the thickness, or the lateral shape and size of the porous region. The thickness and lateral shape and size of the porous region may be tuned by controlling the thickness, shape and size of the n-doped region of III-nitride material deposited prior to porosification. The thickness of the porous region may also be tuned by controlling the depth to which porosification extends downwards into the III-nitride material during electrochemical porosification. The porosity of the porous region may be tuned by controlling the electrochemical porosification parameters and/or by controlling the doping concentration of the n-doped region of III-nitride material deposited prior to porosification.

Tuning the second warp may comprise compensating the first warp that results from the substrate and the first layer of III-nitride material having different thermal coefficients of expansion.

The method may comprise the step of forming, over the porous region, one or more further layers of III-nitride material.

The method may comprise any of the features discussed above in relation to the first aspect of the invention.

Method of Manufacturing a Semiconductor Device

According to a first aspect of the present invention there is provided a method of manufacturing a semiconductor device, the method comprising the steps of manufacturing a layered semiconductor structure having a porous region according to the first aspect of the invention; and forming, over the porous region, a semiconductor device structure.

The method may comprise the step of forming a second layer of III-nitride material over the porous region before forming the semiconductor device structure on the second layer of III-nitride material.

The semiconductor structure may be an LED, a mini-LED, a micro-LED, a power electronics device, or an RF electronics device.

Semiconductor Structure

According to a third aspect of the present invention there is provided a layered semiconductor structure having controllable bow comprising:

a first layer of III-nitride semiconductor material on a substrate; and a porous region of III-nitride semiconductor material over the first layer of III-nitride semiconductor material, in which the layered semiconductor structure comprising the porous region has a second bow, and wherein the second bow is tunable by tuning a porosity and/or thickness of the porous region.

The substrate and the first layer of III-nitride semiconductor material may have different thermal coefficients of expansion.

The first III-nitride layer may contain one or more layers or stacks of the following in any sequence: GaN, $Al_xGa_{1-x}N$ in which x=0-1, or $In_yGa_{1-y}N$ in which y=0-1.

The porous region may comprise one or more porous layers or stacks of the following in any sequence: GaN, $Al_xGa_{1-x}N$ in which x=0-1, or $In_yGa_{1-y}N$ in which y=0-1.

The semiconductor structure may comprise a second layer of III-nitride material over the porous region.

The second III-nitride layer may contain one or more layers or stacks of the following in any sequence: GaN, $Al_xGa_{1-x}N$ in which x=0-1, or $In_yGa_{1-y}N$ in which y=0-1.

The porous region may preferably have a porosity of between 10% and 90% porous, preferably between 15% and 80% porous, or between 20% and 70% porous.

The porous region may have a thickness of between 100 nm and 10000 nm, preferably at least 500 nm or 1000 nm.

The porous region may be a porous layer, such that the semiconductor structure comprises a porous layer of III-nitride material over the first layer of III-nitride material. In some embodiments, the porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. Further layers of III-nitride material may be formed over a porous region comprising a stack of porous layers of III-nitride material.

In preferred embodiments, an overgrown semiconductor device may be positioned over a single porous layer or a stack of multiple porous layers of III-nitride material. Thus, rather than being a single porous layer of III-nitride material, the porous region may also be a stack of layers of III-nitride material in which at least some layers are porous.

The stack of porous layers may preferably be a stack of alternating porous and non-porous layers. Preferably the stack comprises between 2 and 100 pairs of porous and non-porous layers, stacked one on top of another. The porous layers may preferably have a thickness of between 10 nm and 200 nm, and the non-porous layers may preferably have a thickness of between 5 nm and 180 nm.

Preferably the porous region, or each porous layer in the stack, has a porosity of between 10% and 90% porosity, or between 20% and 80% porosity.

The semiconductor structure preferably comprises a non-porous intermediate layer of III-nitride material between the porous region and a second layer of III-nitride material, which may form part of a semiconductor device structure. As the porous region is preferably formed by electrochemical porosification through a non-porous layer of III-nitride material, using the method of PCT/GB2017/052895 (published as WO2019/063957) and PCT/GB2019/050213 (published as WO2019/145728), the non-porous layer of III-nitride material typically forms a non-porous intermediate layer which remains on top of the porous region. The non-porous intermediate layer may advantageously provide a smooth surface for overgrowth of further layers or device structures during manufacture.

Semiconductor Device

A semiconductor device, comprising:

a layered semiconductor structure having a porous region according to the third aspect, and a semiconductor device structure over the porous region of III-nitride material.

The semiconductor device may comprise an intermediate layer of III-nitride material over the porous region, and/or a second layer of III-nitride material between the porous region and the semiconductor device structure.

The semiconductor device structure preferably overlies the layered semiconductor structure.

In preferred embodiments, the semiconductor device structure may be an LED, a mini-LED, a micro-LED, a laser (edge emitting or surface emitting), a power electronics device, or an RF electronics device, for example in passive (resonator, filter) or active (amplifier, transistor) components.

The semiconductor device may be, for example, a power electronics component, or an RF electronics component. In particularly preferred examples, the semiconductor device may be a passive electronic component, such as a resonator or a filter, or an active component such as an amplifier or a transistor. Thus the semiconductor device structure may be a resonator structure, or a filter structure, or an amplifier structure, or a transistor structure.

The semiconductor device structure itself may be a known structure, for example a conventional LED structure or a known layered structure usable for a conventional power or RF electronics device, which is in this case overgrown on a semiconductor structure according to an aspect of the present invention. The strain relaxation and warp reduction benefit of the present invention may thus advantageously provide a strain relaxation and warp reduction benefit to the overgrown device structure.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

It should also be understood that the methods and structures of the present invention are not limited to the particular examples described herein, but can be implemented in other examples without departing from the scope of the disclosure.

BRIEF DESCRIPTION OF THE DRAWINGS

Specific embodiments of the invention will now be described with reference to the figures, in which:

FIGS. 1A, 1B and 1C schematically illustrate three different cases of a first III-nitride layer 20 formed on a substrate 10.

In FIG. 1A, the wafer bow is zero, or close to zero, so the wafer, in other words the semiconductor structure consisting of the substrate and the first III-nitride layer, is flat.

In FIG. 1B, the wafer has a convex bow, such that the centre of the wafer is curved upwards to a height above the edges of the wafer. In this configuration, the upper surface of the wafer is under tensile stress. This means that the wafer does not sit flat upon a flat surface, as is desirable for further processing and further overgrowth.

The curvature, or bow, of the wafer, can be quantified by measuring the height profile across the wafer and calculating the bow according to conventional techniques.

Figures 1A, 1B, 1C, 2A, 2B:
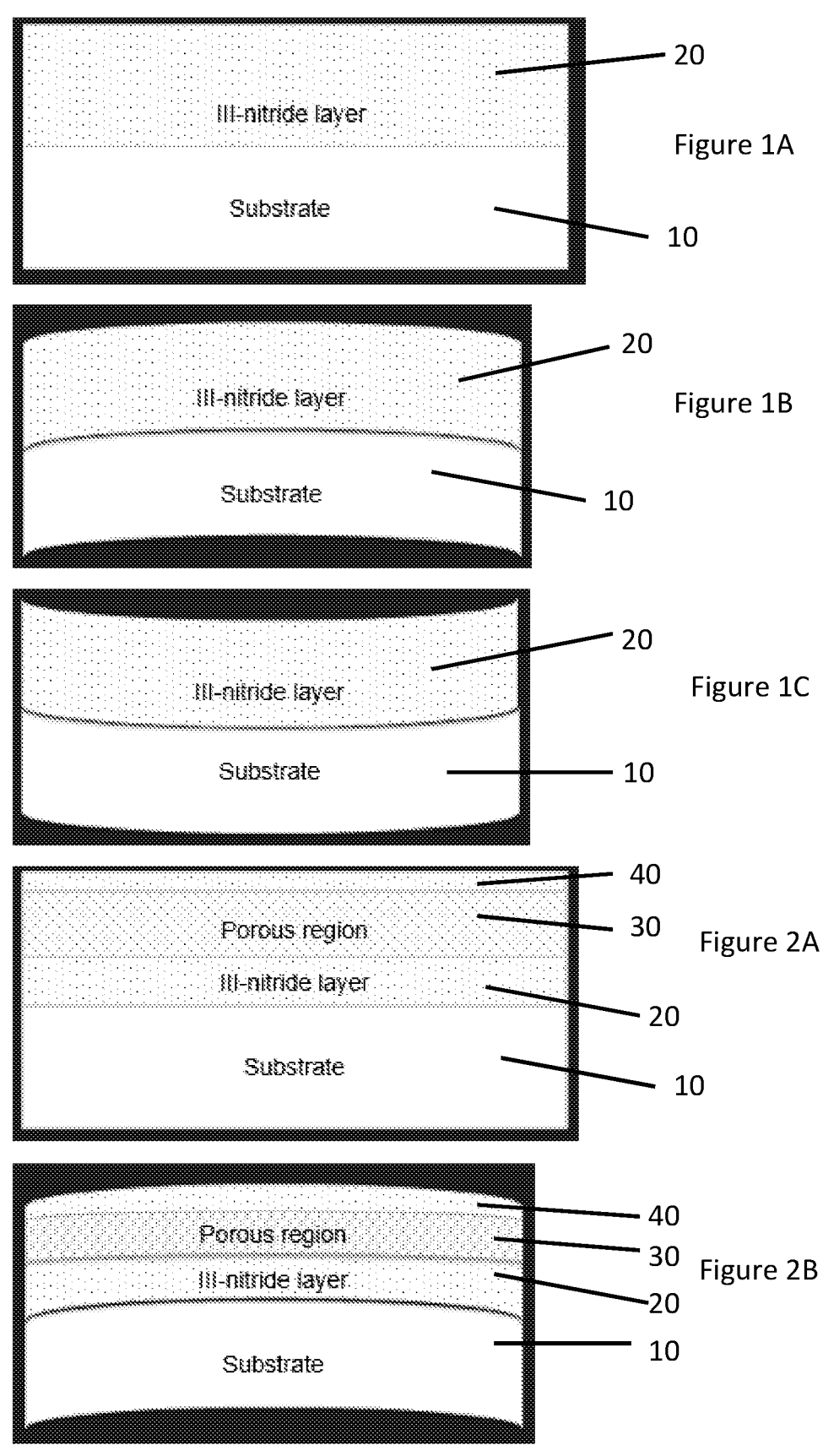
FIG. 1A is a schematic side-on cross-section of a layered semiconductor structure comprising a substrate and a first III-nitride layer.
FIG. 1B is a schematic side-on cross-section of a layered semiconductor structure comprising a substrate and a first III-nitride layer, with a convex bow.
FIG. 1C is a schematic side-on cross-section of a layered semiconductor structure comprising a substrate and a first III-nitride layer, with a concave bow.
FIG. 2A is a schematic side-on cross-section of a layered semiconductor structure comprising a substrate, a first III-nitride layer and a porous region over the first III-nitride layer.
FIG. 2B is a schematic side-on cross-section of a layered semiconductor structure comprising a substrate, a first III-nitride layer and a porous region over the first III-nitride layer, with a convex bow.

In FIG. 1C, the wafer has a concave bow, such that the edges of the wafer are curved upwards to a height above the centre of the wafer. In this configuration, the upper surface of the wafer is under compressive stress. This means that the wafer does not sit flat upon a flat surface, as is desirable for further processing and further overgrowth.

Figures 2C, 3A, 3B, 3C:
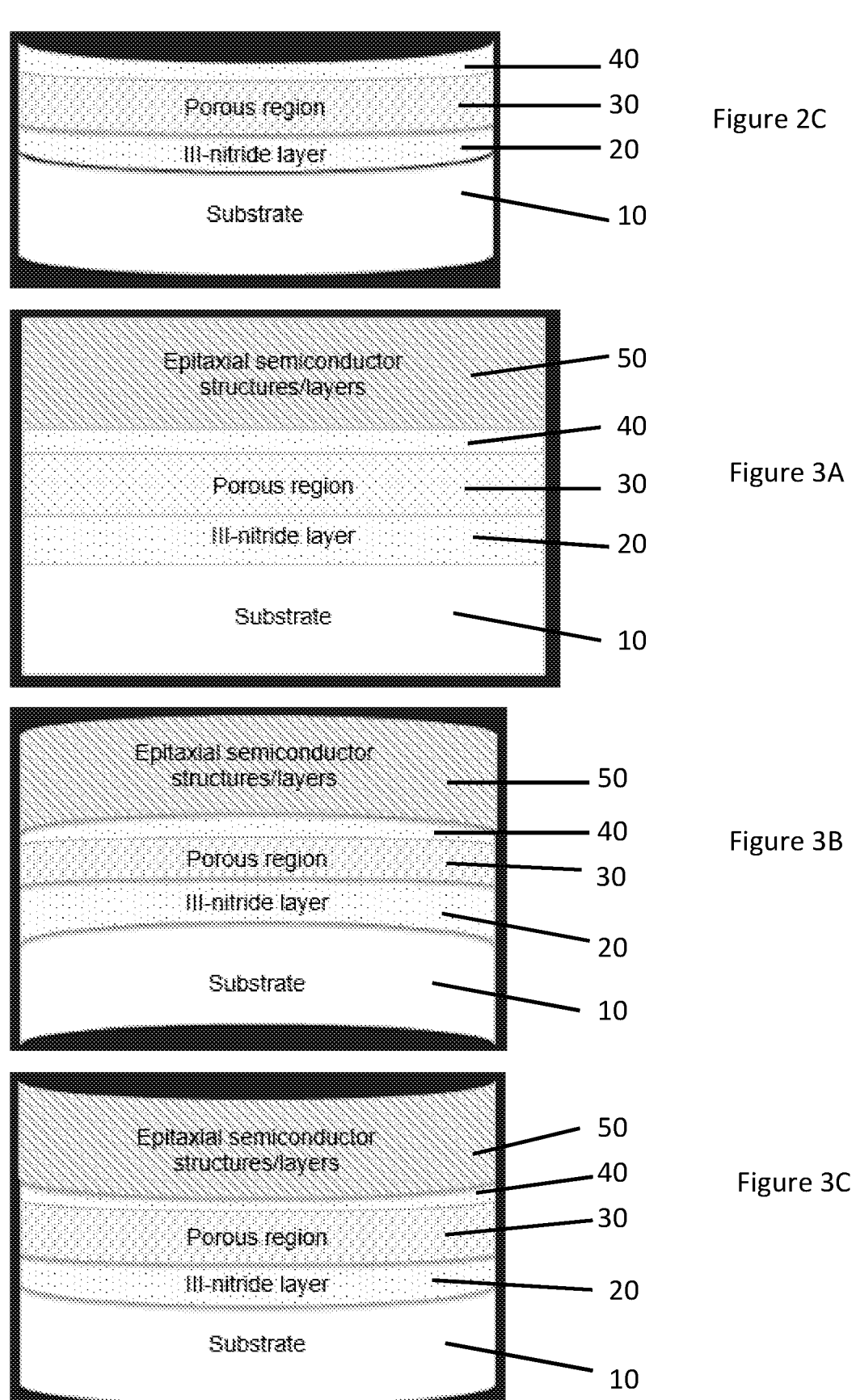
FIG. 2C is a schematic side-on cross-section of a layered semiconductor structure comprising a substrate, a first III-nitride layer and a porous region over the first III-nitride layer, with a concave bow.
FIG. 3A is a schematic side-on cross-section of a layered semiconductor structure comprising a substrate, a first III-nitride layer, a porous region over the first III-nitride layer, and further epitaxial semiconductor layers or structures formed over the porous region.
FIG. 3B is a schematic side-on cross-section of a layered semiconductor structure comprising a substrate, a first III-nitride layer, a porous region over the first III-nitride layer, and further epitaxial semiconductor layers or structures formed over the porous region, with a convex bow.
FIG. 3C is a schematic side-on cross-section of a layered semiconductor structure comprising a substrate, a first III-nitride layer, a porous region over the first III-nitride layer, and further epitaxial semiconductor layers or structures formed over the porous region, with a concave bow.

FIGS. 2A, 2B and 2C illustrate the structures of FIGS. 1A, 1B and 1C after formation of porous regions 30 (illustrated as porous layers) above the first III-nitride layers 10. Non-porous intermediate layers 40 of III-nitride material are positioned over the porous region 30.

As described above, electrochemical porosification of the porous region 30 is preferably carried out by porosification of n-doped III-nitride material through the undoped, non-porous intermediate layer 40. The intermediate layer 40 then forms a smooth surface for overgrowth of further epitaxial layers or device structures.

As described above, the formation of the porous region 30 in the semiconductor structure reduces the stress in the layered structure, and reduces the curvature or bow of the overall structure. Thus the bow of the structures in FIGS. 2B and 2C is advantageously less than that of the corresponding structures in FIGS. 1B and 1C. The structure in FIG. 2A also advantageously experiences a reduction in the stresses and strains in the semiconductor structure relative to FIG. 1A.

FIGS. 3A, 3B and 3C illustrate the structures of FIGS. 2A, 2B and 2C after formation of further epitaxial semiconductor structures or layers over the non-porous intermediate layers 40.

These further epitaxial semiconductor structures or layers may comprise a second layer of III-nitride material, and/or a semiconductor device structure. Whatever layer or device structure is overgrown will advantageously benefit from the reduced stress and bow of the underlying layered semiconductor structure. This has benefits both in ease of manufacturing and processing steps during device growth, and in superior performance of the resulting devices, as the resulting devices do not contain stresses and strains inherited from growth over a stressed underlying structure.

The stress and bow reduction that is obtained in the structures after formation of the porous region may be controlled by varying, or tuning, the size and shape, thickness and/or porosity of the porous region. For example the size and shape of the porous region(s) may be controlled by controlling epitaxial deposition of the n-doped region(s) that will be porosified, and the pore size and % porosity of the porous region(s) may be controlled by varying the electro-chemical porosification parameters and the charge carrier concentration of the porous region, as described in international patent applications PCT/GB2017/052895 (published as WO2019/063957) and PCT/GB2019/050213 (published as WO2019/145728).

Figure 4:
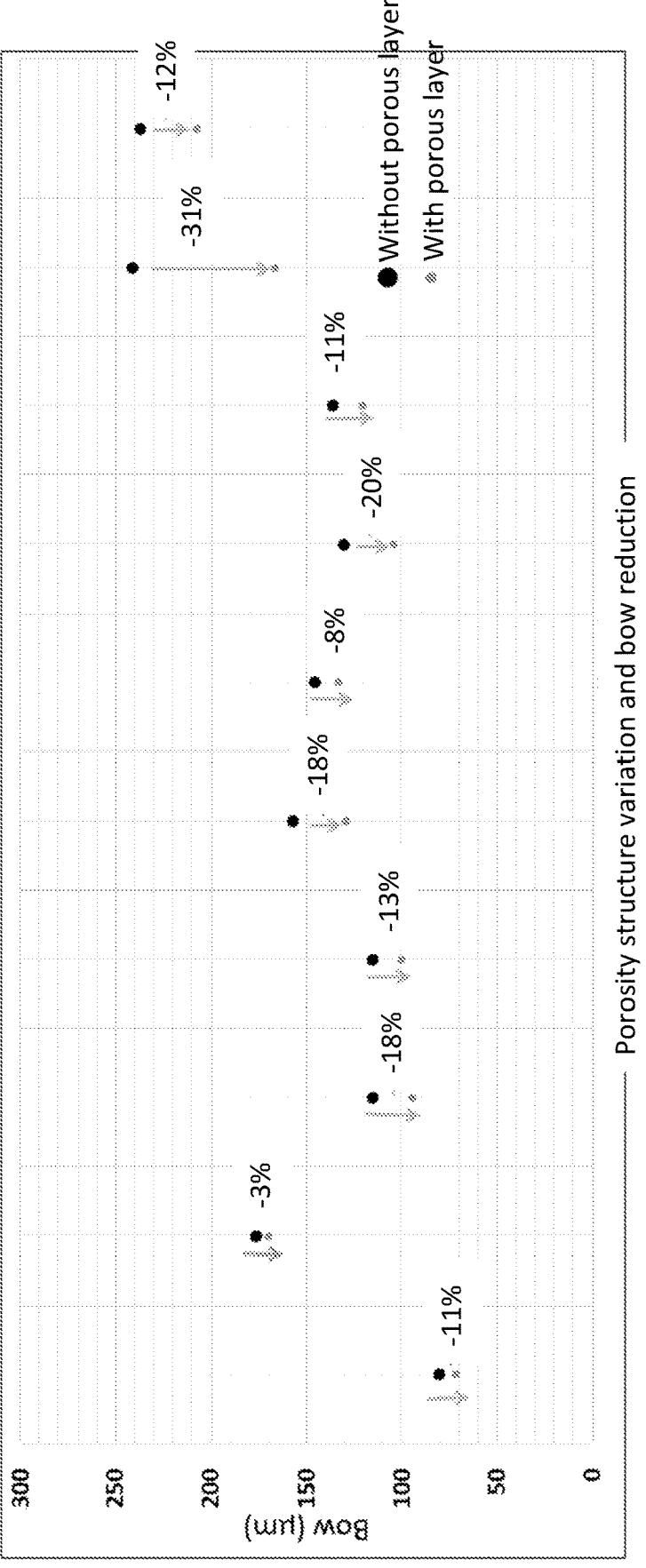
FIG. 4 shows the reduction in wafer bow on formation of a porous region, measured for a variety of different layered semiconductor structures according to the present invention.

FIG. 4 shows the reduction in wafer bow on formation of a porous region, measured for a variety of different layered semiconductor structures according to the present invention. For all structures tested, the layered semiconductor structure experienced a reduction in wafer bow following formation of the porous region. The smallest wafer bow reduction was a 3% reduction, corresponding to a reduction of around 7 μm of wafer bow. The largest wafer bow reduction was a 31% reduction in wafer bow, corresponding to a reduction of around 75 μm of wafer bow. This clearly demonstrates that the formation of a porous layer of III-nitride material over a first III-nitride layer on a substrate, leads to a reduction in the stress and resulting wafer bow of the semiconductor structure.

Figure 5A:
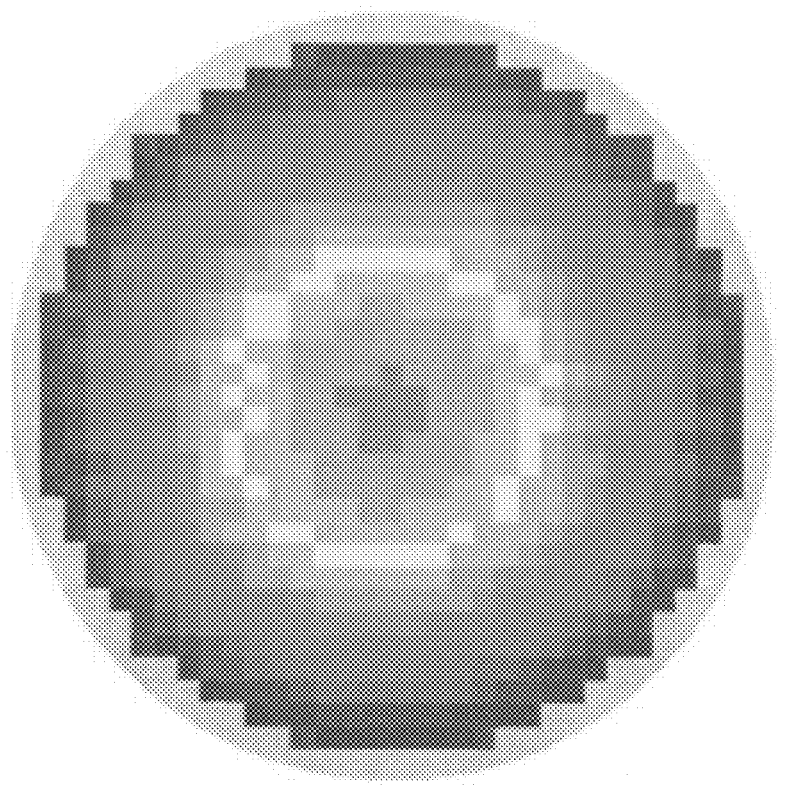
FIG. 5A shows an example Bow map of a GaN layered semiconductor template before porosification of the porous region.
Figure 5B:
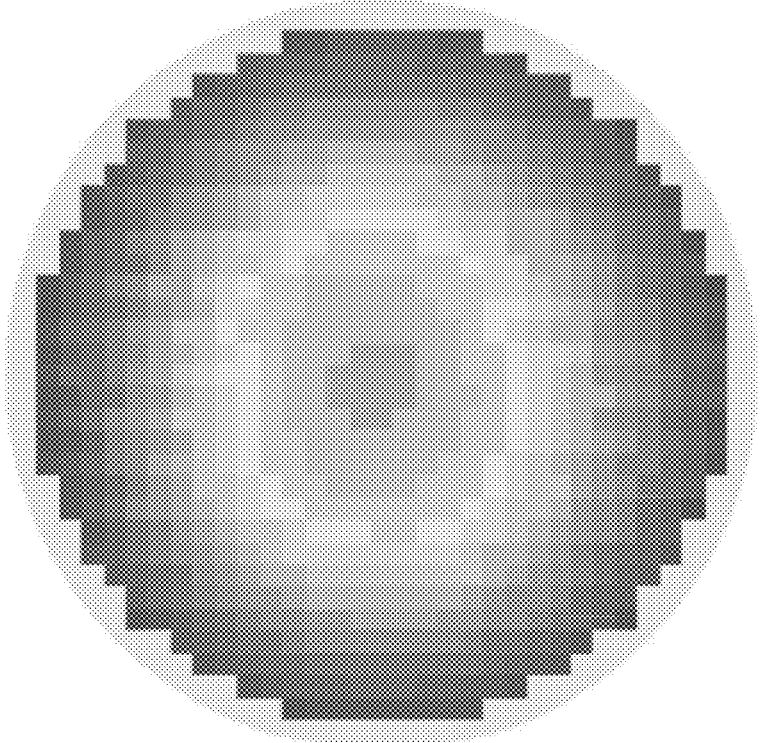
FIG. 5B shows a Bow map of the structure of FIG. 5A, after porosification of the porous region.
Figure 5B:
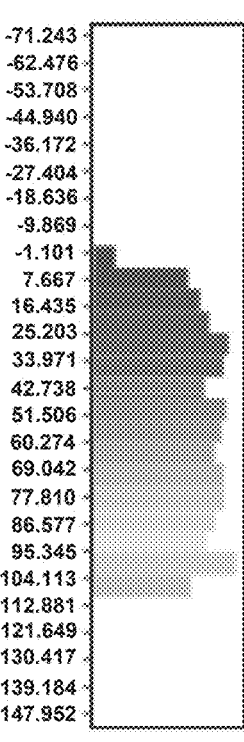

FIG. 5A shows an example Bow map of a GaN layered semiconductor template before porosification of the porous region, while FIG. 5B shows a Bow map of the structure of FIG. 5A, after porosification of the porous region. Comparison of these bow maps shows that after porosification, the wafer (consisting of a GaN layer on a substrate) was significantly less bowed.

The invention claimed is:

1. A method of controlling bow in a layered semiconductor structure, the method comprising the steps of:

providing a layered semiconductor structure comprising a first layer of III-nitride semiconductor material on a substrate, the layered semiconductor structure having a first bow; and forming a porous region of III-nitride semiconductor material over the first layer of III-nitride semiconductor material, so that an overall porosity of the semiconductor structure positioned on the substrate, including the first layer of III-nitride material and the porous region, is between 5% and 90% porous, in which the layered semiconductor structure comprising the porous region has a second bow different from the first bow.

2. The method according to claim 1, in which the first bow is a concave bow, and in which the second bow is less concave than the first bow.

3. The method according to claim 1, in which the first bow is a convex bow, and in which the second bow is less convex than the first bow.

4. The method according to claim 1, in which the second bow is between 1% and 80% less than the first bow, or between 3% and 70% less than the first bow, or between 8% and 65% less than the first bow.

5. The method according to claim 1, in which the second bow is between 5 μm and 150 μm less than the first bow, or between 10 μm and 100 μm less than the first bow, or between 25 μm and 50 μm less than the first bow.

6. The method according to claim 1, in which the overall porosity of the semiconductor structure positioned on the substrate, including the first III-nitride layer and the porous region, is between 10% and 80% porous, or between 20% and 70% porous.

7. The method according to claim 1, including the step of tuning the second bow, in which tuning the second bow comprises tuning at least one of the porosity or the thickness of the porous region.

8. The method according to claim 1, wherein the tuning the second bow comprises compensating the first bow that results from the substrate and the first layer of III-nitride material having different thermal coefficients of expansion.

9. The method according to claim 1, in which the step of forming a porous layer of III-nitride semiconductor material over the first layer of III-nitride semiconductor material comprises depositing an n-doped region of III-nitride material over the first layer of semiconductor material, and electrochemically porosifying the n-doped region of III-nitride material to form the porous region of III-nitride material.

10. The method according to claim 1, comprising the step of forming the porous region of III-nitride material by electrochemical porosification through a non-porous layer of III-nitride material, such that the non-porous layer of III-nitride material forms a non-porous intermediate layer over the porous region.

11. The method according to claim 1, in which the porous region has a porosity of between 10% and 80% porous, and/or in which the porous region has a thickness of between 100 nm and 10000 nm.

12. The method according to claim 1, in which the porous region is a continuous porous layer having a uniform porosity, which extends over the lateral width of the first layer of III-nitride material.

13. The method according to claim 1, in which the porous region extends over only a portion of the lateral width of the first layer of III-nitride material.

14. The method according to claim 13, in which the porous region is patterned on the first layer.

15. The method according to claim 1, in which the porous region of III-nitride material comprises at least one porous layer of III-nitride material.

16. The method according to claim 15, in which the porous region of III-nitride material comprises a stack of multiple porous layers of III-nitride material, in which the stack of porous layers is a stack of alternating porous and non-porous layers.

17. The method according to claim 1, in which the first III-nitride layer contains one or more layers or stacks of the following in any sequence: GaN, $Al_xGa_{1-x}N$ in which x=0-1, or $In_yGa_{1-y}N$ in which y=0-1.

18. The method according to claim 1, in which the substrate is one of: sapphire, silicon, silicon carbide, GaN, AlN, InGaN bulk, oxidized & porous silicon or glass/fused silica.

19. The method of manufacturing a semiconductor device, the method comprising the steps of manufacturing a layered semiconductor structure having a porous region according to claim 1; and forming, over the porous region, a semiconductor device structure.

20. The method according to claim 19, comprising the step of forming a second layer of III-nitride material over the porous region before forming the semiconductor device structure on the second layer of III-nitride material.

21. The method according to claim 19, in which the semiconductor structure is an LED, a mini-LED, a micro-LED, a power electronics device, or an RF electronics device.

22. A semiconductor structure having controllable bow comprising:

a first layer of III-nitride semiconductor material on a substrate; and a porous region of III-nitride semiconductor material over the first layer of III-nitride semiconductor material, in which the layered semiconductor structure comprising the porous region has a second bow, and wherein the second bow is tunable by tuning a porosity and/or thickness of the porous region, in which an overall porosity of the semiconductor structure positioned on the substrate, including the first III-nitride layer and the porous region, is between 5% and 90% porous.

* * * * *